United States Patent
Lee

[11] Patent Number: 6,069,032
[45] Date of Patent: May 30, 2000

[54] SALICIDE PROCESS

[75] Inventor: Tong-Hsin Lee, Taipei Hsien, Taiwan

[73] Assignees: United Silicon Incorporated; United Microelectronics Corp., both of Hsinchu, Taiwan

[21] Appl. No.: 09/375,619

[22] Filed: Aug. 17, 1999

[51] Int. Cl.[7] .................................................. H01L 21/336

[52] U.S. Cl. .......................... 438/197; 438/303; 438/586; 438/596; 438/655

[58] Field of Search ...................... 438/197, 233, 438/299, 303, 305, 585, 586, 596, 649, 651, 655, 682, 683, 713, 714; 257/384, 413

[56] References Cited

U.S. PATENT DOCUMENTS

| | | | |
|---|---|---|---|
| 5,726,479 | 3/1998 | Matsumoto et al. | 257/412 |
| 5,739,573 | 4/1998 | Kawaguchi | 257/384 |
| 5,766,969 | 6/1998 | Fulford, Jr. et al. | 438/305 |
| 6,011,290 | 1/2000 | Gardner et al. | 257/345 |

*Primary Examiner*—T. N. Quach
*Attorney, Agent, or Firm*—Thomas, Kayden, Horstemeyer & Risley

[57] ABSTRACT

A salicide process is described. The edge of a gate are etched to form a reversed T-shaped gate that is then self-aligned by a silicide film. This etching step can be performed by using a silicon oxynitride layer as an etching mask over the gate.

20 Claims, 3 Drawing Sheets

SALICIDE PROCESS

BACKGROUND OF THE INVENTION

1. Field of Invention

The present invention relates to a MOS process sequence. More particularly, the present invention relates to a salicide process.

2. Description of Related Art

FIGS. 1A–1C are schematic, cross-sectional views of a conventional salicide process.

As shown in Fig. 1A, several device isolation regions 102 are formed and over a substrate 100. A thin oxide layer 104 is formed between the isolation regions 102 over the substrate 100. A gate 106 and a gate sidewall spacer 108 thereof are formed over the thin oxide layer 104.

As shown in FIG. 1B, ions are implanted into the substrate 100. An annealing step is then performed to form source/drain regions 110.

As shown in FIG. 1C, the gate 106 and the source/drain regions 110 are covered by a silicide film 112. Because those silicide films 112 are formed using a self-aligned process that does not entail any additional masking steps, the silicide-covering process is referred to as a salicide process.

The salicide process in a CMOS process reduces the gate resistance. However, the gate resistance, such as gate sheet resistance, increases as the gate length reduces. On the other hand, increasing the gate area is important to improve the gate sheet resistance. Therefore, there is a need for a new salicide process that can increase the gate area to improve the gate resistance.

SUMMARY OF THE INVENTION

The invention provides a salicide process. A gate with a sidewall is provided over a substrate. A first spacer is formed on the sidewall of the gate. The gate is partially removed to create an opening on the gate, wherein the opening has a sidewall composed of the first spacer. A second spacer is formed on the sidewall of the opening. A mask layer partially filling the opening is formed. The second spacer is removed. The gate is etched to form a plurality of trenches into the two sides of the gate by using the mask layer as an etching mask. A self-aligned silicide is formed over the etched gate.

In this present invention, the two sides of the gate are etched to increase the gate area, thereby reducing the gate resistance after forming a self-aligned silicide film over the etched gate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A–2H are schematic, cross-sectional views of a salicide process according to one preferred embodiment of this invention. Although the salicide process will be described according to the preferred embodiment, it is to be understood that the scope of the invention is not limited to the disclosed process. Therefore, persons skilled in the art can modify and arrange the disclosed process by, for example, adding or deleting a step(s) without departing from the spirit of the invention.

Figure 1A:
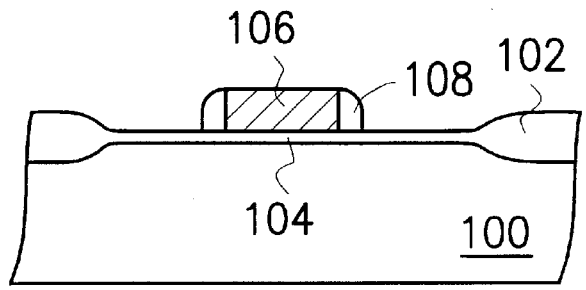
FIGS. 1A–1C are schematic, cross-sectional views of a conventional salicide process.
Figure 1B:
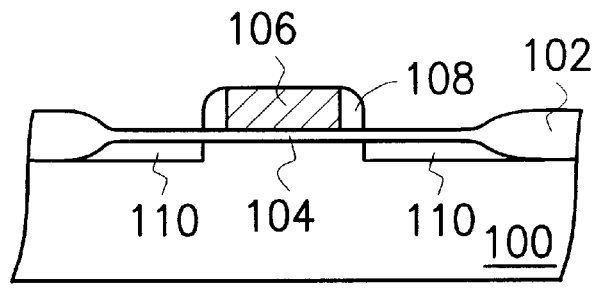
Figure 1C:
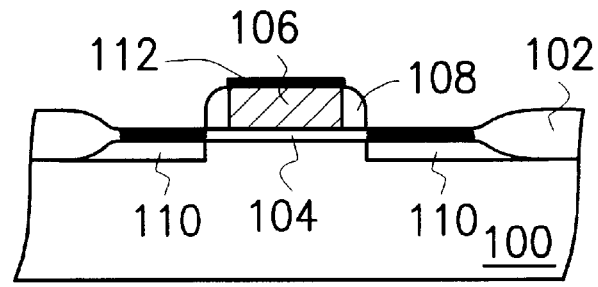
Figure 2A:
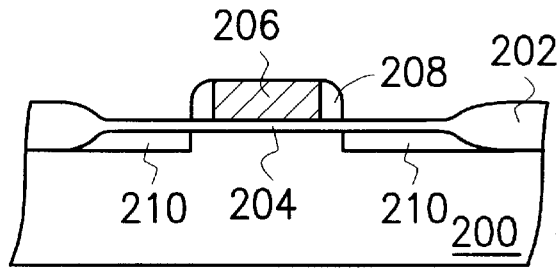
FIGS. 2A–2H are schematic, cross-sectional views of a salicide process according to one preferred embodiment of this invention.

As shown in FIG. 2A, a MOS device comprising a gate 206 and source/drain regions 210 is formed on a substrate 200 (e.g. silicon substrate). The MOS device can be formed by steps comprising, for example, a polysilicon deposition step, a gate patterning step, an implanting step, and an annealing step. After a thin oxide layer 204 is formed between several device isolation regions 202 on the substrate 200, a polysilicon layer (not shown) is deposited over the substrate 200 in the polysilicon step and is then patterned form a gate 206 on the thin oxide layer 204 in the gate patterning step. After the gate sidewall spacer 208 is formed, ions are implanted into the substrate in the implanting step and are then annealed for the formation of source/drain regions 210 in the annealing step.

Preferably, the polysilicon layer is deposited to a thickness of about 4000 to about 5000 angstroms. The thin oxide layer 204 and the device isolation regions 202 can be made of silicon oxide by thermal oxidation. The device isolation regions 202 can be alternatively formed by a shallow trench isolation technique.

Figure 2B:
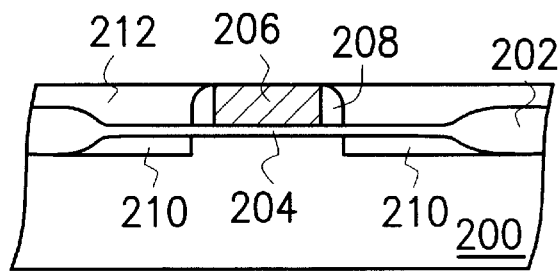

As shown in FIG. 2B, a first dielectric layer 212 is formed to surround the gate sidewall spacer 208 and to cover the substrate 200. A process for forming the first dielectric layer 212 comprises a deposition step and a polishing step. In the deposition step, a first dielectric material layer (not shown) is deposited over the substrate 200, wherein a portion of the first dielectric material layer is higher than and covers the gate 206. In the polishing step, the portion of the first dielectric material layer higher than the gate 206 is removed by means of chemical-mechanical polishing, and the remaining first dielectric material layer serves as the desired first dielectric layer 212. The first dielectric material can be nitride, or preferably be silicon nitride.

Figure 2C:
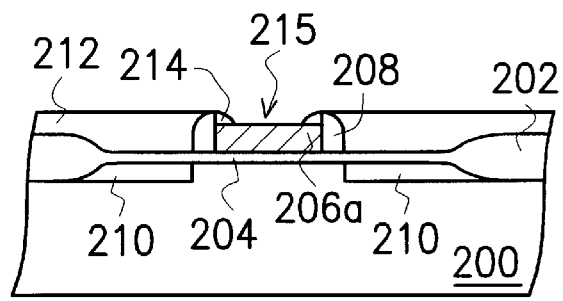

As shown in FIG. 2C, the gate 206 (shown in FIG. 2B) is partially removed. After being partially removed, the gate 206a has a top surface substantially lower than that of the first dielectric layer 212. In other words, an opening 215 with a sidewall is formed on the remaining gate 206a after the gate 206 is partially removed. The opening 215 is formed to a depth of about 1000 angstroms. That is, the remaining gate 206a has a thickness of about 3000 to about 4000 angstroms, because the gate 206 (shown in FIG. 2B) preferably has a thickness of about 4000 to about 5000 angstroms before being partially removed. The formed spacer 214 covers an edge of the exposed gate 206a.

Another spacer 214 is formed on the sidewalls of the opening 215. The spacer 214, with a width of about 500 angstroms, can be formed by performing a deposition step and an etch back step. In the deposition step, an oxide layer (not shown), preferably a silicon oxide layer, is formed to over-filling the opening 215. In the etch back step, the deposited oxide layer is etched back until the first dielectric layer 212 is exposed.

Figure 2D:
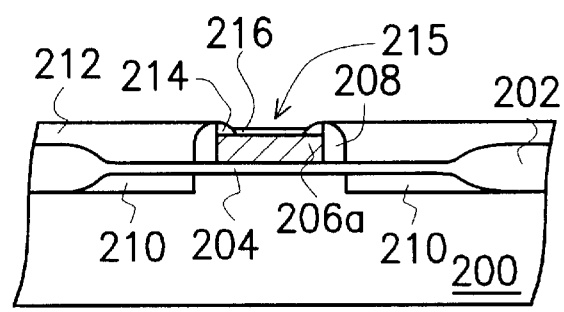

As shown in FIG. 2D, a second dielectric layer 216 is formed to partially fill the opening 215 over the gate 206a.

This formation process comprises, for example, a deposition step and an over-polishing step. In the deposition step, a second dielectric material layer (not shown) is deposited to fill the opening 215 and to cover the first dielectric layer 212. In the over-polishing step, the second dielectric material layer is over-polished by means of chemical-mechanical polishing. After being over-polished, the second dielectric material layer, having a top surface lower than that of the first dielectric layer 212, serves as the second dielectric layer 216 that partially fills the opening. The second dielectric layer 216 can be made of nitride, or preferably be made of silicon oxynitride (SiON).

In addition to the over-polishing step, an etching back step can alternatively accomplish the formation of the second dielectric layer 216. In this etching back step, the second dielectric material layer is etched back to have a top surface substantially lower than that of the first dielectric layer 212, and therefore to create the second dielectric layer 216.

Figure 2E:
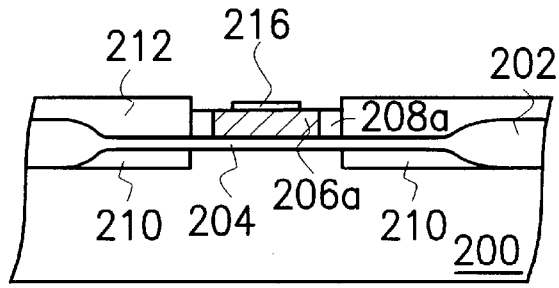

As shown in FIG. 2E, the spacer 214 (shown in FIG. 2D) is removed from the sidewall of the opening 215 (shown in FIG. 2D), so that the edge of the gate 206a is exposed. The spacer 214 can be removed by wet etching. Although the tips of the gate sidewall spacer 208 (shown in FIG. 2D), and a tiny portion of the first dielectric layer 212 substantially close to the tips may also be simultaneously removed in this removal step, such partial removal phenomenon does not depart from the spirit of the present invention.

Figure 2F:
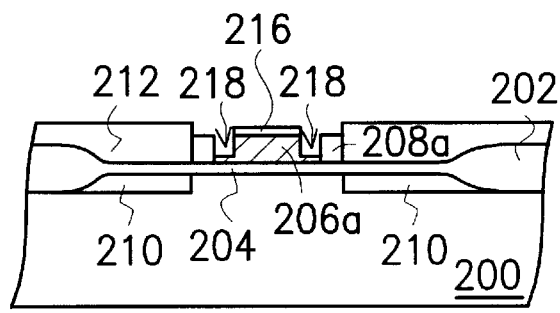

As shown in FIG. 2F, the edge of the gate 206a are etched, with the second dielectric layer 216, the gate sidewall spacer 208a and the first dielectric layer 212 serving as an etching mask. After this etching step, the edge of the gate 206a are substantially lower than the center of the gate 206a. Such etched gate 206a, also a called a reversed T-shaped gate, is incorporated with the gate sidewall spacer 208a to form two trenches 218 on the edge of the etched gate 206a. Each of the trenches 218 preferably has a depth of about 2000 angstroms, and can be adjusted to optimize each process, but only if the trench 218 does not expose the thin oxide layer 204.

Figure 2G:
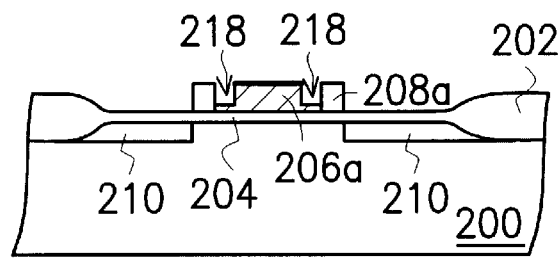

As shown in FIG. 2G, the first and the second dielectric layers 212 and 216 (shown in FIG. 2F) are removed with, for example, a phosphorous acid ($H_3PO_4$) solution.

Figure 2H:
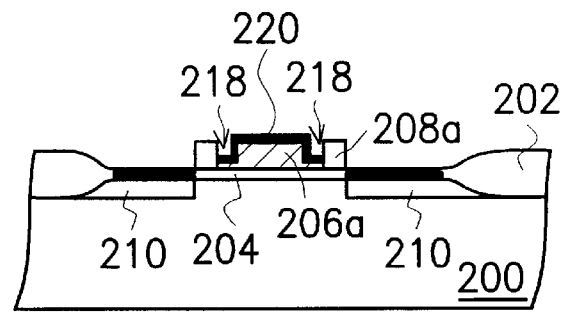

As shown in FIG. 2H, both the gate 206a and the source/drain regions 210 are covered by a silicide film 220. Because those silicide films 220 are formed using a self-aligned process that does not entail any additional masking steps, the silicide-covering process is referred to as a salicide process. If the substrate 200 and the thin oxide layer 204 are made of silicon and silicon oxide respectively, the salicide process can be performed by a metal deposition step and an annealing step. In the metal deposition step, a metal layer (not shown), such as titanium, tungsten or cobalt layer, is deposited over the substrate 200. In the annealing step, a portion of the metal layer is transformed into several silicide films 220 that self-align over the gate 206a and the source/drain regions 210, respectively. The silicide films 220 can be made of titanium silicon, tungsten silicon, or cobalt silicon, according to the need of each process.

In this present invention, the edge of the gate are etched to increase the gate area, thereby reducing the gate resistance after forming a self-aligned silicide film over the etched gate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A salicide process, comprising:

providing a gate with a sidewall over a substrate;

forming a first spacer on the sidewall of the gate;

partially removing the gate to create an opening on the gate, wherein the opening has a sidewall composed of the first spacer;

forming a second spacer on the sidewall of the opening;

forming a mask layer partially filling the opening;

removing the second spacer;

etching the gate to form a plurality of trenches into the edge of the gate, with the mask layer serving as an etching mask; and forming a self-aligned silicide over the etched gate.

2. The process of claim 1, wherein the gate has a thickness of about 4000 to about 5000 angstroms before being partially removed.

3. The process of claim 1, wherein the opening has a depth of about 1000 angstroms.

4. The process of claim 1, wherein each of the trenches has a depth of about 2000 angstroms.

5. The process of claim 1, wherein the second spacer has a width of about 500 angstroms.

6. The process of claim 1, wherein the mask layer is made of silicon oxynitride.

7. The process of claim 1, wherein the second spacer is made of silicon oxide.

8. The process of claim 1, further comprising the step of forming a dielectric layer surrounding the first spacer over the substrate before partially removing the gate.

9. The process of claim 8, wherein the dielectric layer is made of silicon nitride.

10. The process of claim 8, wherein the formation of the dielectric layer comprises:

depositing a dielectric material layer over the substrate, wherein the dielectric material layer has a top surface higher than a top surface of the gate; and chemical-mechanical polishing the dielectric layer until the gate is exposed.

11. The process of claim 8, wherein the formation of the mask layer comprises:

depositing a silicon oxynitride layer over the dielectric layer and the gate; and over-polishing the silicon oxynitride layer over the dielectric layer, thereby accomplishing the formation of the mask layer that partially fills the opening.

12. The process of claim 8, wherein the formation of the mask layer comprises:

depositing a silicon oxynitride layer over the dielectric layer and the gate; and etching back the silicon oxynitride layer until the silicon oxynitride layer has a top surface lower than the top surface of the dielectric layer.

13. A salicide process, comprising:

providing a gate with a sidewall over a substrate;

forming a spacer on the sidewall of the gate;

forming a mask pattern exposing the edge of the gate;

etching the gate to form a reversed T-shaped gate by using the mask pattern as an etching mask, whereby the edge of the reversed T-shaped gate are substantially lower than the center of the gate; and forming a self-aligned silicide film over the reversed T-shaped gate.

14. The process of claim 13, wherein the mask pattern is made of silicon oxynitride.

15. The process of claim 13, further comprising the step of forming a dielectric layer surrounding the first spacer over the substrate before forming the mask pattern.

16. The process of claim 15, wherein the dielectric layer is made of silicon nitride.

17. The process of claim 15, wherein the formation of the dielectric layer comprises:

depositing a dielectric material layer over the substrate, wherein the dielectric material layer has a top surface higher than a top surface of the gate; and chemical-mechanical polishing the dielectric layer until the gate is exposed.

18. The process of claim 15, wherein the formation of the mask pattern comprises:

depositing a silicon oxynitride layer over the dielectric layer and the gate; and over-polishing the silicon oxynitride layer over the dielectric layer, thereby accomplishing the formation of the mask pattern that partially fills the opening.

19. The process of claim 15, wherein the formation of the mask pattern comprises:

depositing a silicon oxynitride layer over the dielectric layer and the gate; and etching back the silicon oxynitride layer until the silicon oxynitride layer has a top surface lower than the top surface of the dielectric layer.

20. The process of claim 13, wherein the gate has a thickness of about 4000 to about 5000 angstroms before being partially removed.

* * * * *